United States Patent [19]
Roth

[11] Patent Number: 6,002,718
[45] Date of Patent: Dec. 14, 1999

[54] METHOD AND APPARATUS FOR GENERATING RUNLENGTH-LIMITED CODING WITH DC CONTROL

[75] Inventor: Ron M. Roth, Ramat Gan, Israel

[73] Assignee: Hewlett-Packard Company, Palo Alto, Calif.

[21] Appl. No.: 08/549,377

[22] Filed: Oct. 27, 1995

[51] Int. Cl.$^6$ .............................. H04L 25/34; H04B 1/66
[52] U.S. Cl. .......................... 375/240; 375/292; 341/58; 341/59; 341/106; 358/261.4; 700/503
[58] Field of Search ..................... 375/292, 286, 375/287, 296, 240; 341/59, 58, 106; 360/40, 48; 369/59; 395/404, 401, 405, 410, 416, 417, 421.1, 421.11, 612, 114, 2.94, 888; 345/202; 348/404, 403, 420; 358/426, 261.1; 364/715.02; 370/521; 382/245, 244; 704/500, 541, 503

[56] References Cited

U.S. PATENT DOCUMENTS

| | | | |
|---|---|---|---|
| 3,108,261 | 10/1963 | Miller | 340/174.1 |
| 3,518,662 | 6/1970 | Nakagome et al. | 341/56 |
| 4,027,335 | 5/1977 | Miller | 360/40 |
| 4,413,251 | 11/1983 | Adler et al. | 340/347 |
| 5,481,687 | 1/1996 | Goubert et al. | 395/421.02 |
| 5,561,422 | 10/1996 | Kim | 341/67 |
| 5,623,517 | 4/1997 | Braun | 375/262 |
| 5,642,112 | 6/1997 | Cooper | 341/51 |
| 5,663,724 | 9/1997 | Westby | 341/59 |

OTHER PUBLICATIONS

J. C. Mallinson and J. W. Miller, "Optimal Codes for Digital Magnetic Recording", Radio and Elec. Engineering, vol. 47, No. 4, Apr., 1997, pp. 172–176.

J. Gu and T. Fuja, "A New Approach to Constructing Optimal Block Codes for Runlength–Limited Channels", IEEE Transactions on Information Theory, vol. 40, No. 3, May, 1994, pp. 774–785.

B. H. Marcus, P. H. Siegel, and J. K. Wolf, "Finite–State Modulation Codes for Data Storage", IEEE Journal on Selected Areas in Communication, vol. 10, No. 1, Jan., 1992, pp. 5–37.

P. A. Franaszek, "Sequence–State Methods for Run–length–limited Coding", IBM J. Research Development, vol. 14, Jul. 1970, pp. 376–383.

A. M. Patel, "Zero–Modulation Encoding in Magnetic Recording", IBM J. Research Development, vol. 19, Jul., 1975, pp. 366–378.

(List continued on next page.)

*Primary Examiner*—Wellington Chin
*Assistant Examiner*—William Luther
*Attorney, Agent, or Firm*—Denise A. Lee

[57] ABSTRACT

The present invention provides a lossless coding scheme that maps unconstrained binary sequences into sequences that obey the (d,k)-RLL constraint while offering a degree of DC control. In the preferred embodiment, the channel encoder is a state machine which uses a single "overlapping" table for all states rather than using multiple tables. Recognizing that a subset of codewords in a first state $x_i$ are identical to a subset of codewords in the second state $x_j$, the overlapping encoding table uses identical addresses for the subset of identical codewords in the first and second state. Thus addresses for more than one state may point to a single codeword. A number of input bytes can be encoded into two different codewords which have different parity of ones, thus allowing for DC control. Decoding is carried out in a state-independent manner.

38 Claims, 12 Drawing Sheets

OTHER PUBLICATIONS

R. L. Adler, D. Coppersmith, and Martin Hassner, "Algorithms for Sliding Block Codes, An Application of Symbolic Dynamics to Information Theory", IEEE Transaction on Information Theory, vol. 11–29, No. 1, Jan., 1983, pp. 5–21.

Brian H. Marcus, Ron M. Roth, Paul H. Siegel, "Constrained Systems and Coding for Recording Channels", IBM Research Division, RJ 9931 (87890) Jan. 18, 1995 Mathematics, Dec. 21, 1994, pp. 1–151.

K. A. Schouhamer Immink: "Efmplus: The Coding Format of the Multimedia Disc", IEEE Transactions on Consumer Electronics, vol. 41, No. 3, Aug., 1995, pp. 491–497.

D. R. Helman, "General Purpose Data Compression ICs", 36th IEEE Computer Society International Conference, 1991, pp. 344–348.

B. Marcus and P. H. Siegel, "Finite–State Modulation Codes for Data Storage", IEEE Journal on Selected Areas in Communications, vol. 10, No. 1, Jan., 1992, New York, pp. 5–37.

| ADDRESS | CONTENTS OF TABLE (HEXADECIMAL) | | | | | | | | | |
|---|---|---|---|---|---|---|---|---|---|---|
| (DECIMAL) | 0 | 1 | 2 | 3 | 4 | 5 | 6 | 7 | 8 | 9 |
| 0 | 0021 | 0022 | 0024 | 0020 | 0041 | 0081 | 0101 | 0201 | 0249 | 0049 |
| 10 | 0089 | 0091 | 0109 | 0111 | 0121 | 0042 | 0082 | 0102 | 0202 | 0092 |
| 20 | 0112 | 0122 | 0044 | 0048 | 0084 | 0088 | 0090 | 0124 | 0224 | 0244 |
| 30 | 0248 | 0040 | 0080 | 0100 | 0209 | 0211 | 0221 | 0241 | 0212 | 0222 |
| 40 | 0104 | 0108 | 0110 | 0120 | 0204 | 0208 | 0210 | 0220 | 0240 | 0242 |
| 50 | 0401 | 0449 | 0489 | 0491 | 0801 | 0849 | 0889 | 0891 | 0909 | 0911 |
| 60 | 0921 | 1049 | 1089 | 1091 | 0409 | 0411 | 0421 | 0441 | 0481 | 0809 |
| 70 | 0811 | 0821 | 0841 | 0881 | 0901 | 0402 | 0492 | 0802 | 0892 | 0912 |
| 80 | 0922 | 1002 | 0412 | 0422 | 0442 | 0482 | 0812 | 0822 | 0842 | 0882 |
| 90 | 0902 | 0404 | 0408 | 0410 | 0420 | 0804 | 0808 | 0810 | 0820 | 0924 |
| 100 | 0424 | 0444 | 0448 | 0484 | 0488 | 0490 | 0824 | 0844 | 0848 | 0884 |
| 110 | 0888 | 0890 | 0904 | 0908 | 0910 | 0920 | 1024 | 1044 | 0440 | 0480 |
| 120 | 0840 | 0880 | 0900 | 1109 | 1111 | 1121 | 1209 | 1211 | 1221 | 1241 |
| 130 | 1009 | 1011 | 1021 | 1041 | 1081 | 1101 | 1201 | 1249 | 1092 | 1112 |
| 140 | 1122 | 1212 | 1222 | 1242 | 1012 | 1022 | 1042 | 1082 | 1102 | 1202 |
| 150 | 1004 | 1008 | 1010 | 1020 | 1124 | 1224 | 1244 | 1248 | 1048 | 1084 |
| 160 | 1088 | 1090 | 1104 | 1108 | 1110 | 1120 | 1204 | 1208 | 1210 | 1220 |
| 170 | 1040 | 1080 | 1100 | 1240 | 2049 | 2089 | 2091 | 2109 | 2111 | 2121 |
| 180 | 2209 | 2211 | 2221 | 2241 | 2409 | 2411 | 2421 | 2441 | 2481 | 2009 |
| 190 | 2011 | 2021 | 2041 | 2081 | 2101 | 2201 | 2249 | 2401 | 2449 | 2489 |
| 200 | 2092 | 2112 | 2122 | 2212 | 2222 | 2242 | 2412 | 2422 | 2442 | 2482 |
| 210 | 2012 | 2022 | 2042 | 2082 | 2102 | 2202 | 2402 | 2492 | 2004 | 2008 |
| 220 | 2010 | 2020 | 2124 | 2224 | 2244 | 2248 | 2424 | 2444 | 2448 | 2484 |
| 230 | 2488 | 2490 | 2024 | 2044 | 2048 | 2084 | 2088 | 2090 | 2104 | 2108 |
| 240 | 2110 | 2120 | 2204 | 2208 | 2210 | 2220 | 2404 | 2408 | 2410 | 2420 |
| 250 | 2040 | 2080 | 2100 | 2240 | 2440 | 2480 | 2491 | 4022 | 4024 | 4020 |
| 260 | 4041 | 4081 | 4101 | 4201 | 4249 | 4049 | 4089 | 4091 | 4109 | 4111 |
| 270 | 4121 | 4042 | 4082 | 4102 | 4202 | 4092 | 4112 | 4122 | 4044 | 4048 |
| 280 | 4084 | 4088 | 4090 | 4124 | 4224 | 4244 | 4248 | 4040 | 4080 | 4100 |
| 290 | 4209 | 4211 | 4221 | 4241 | 4212 | 4222 | 4104 | 4108 | 4110 | 4120 |
| 300 | 4204 | 4208 | 4210 | 4220 | 4240 | 4242 | 4401 | 4449 | 4489 | 4491 |
| 310 | 4801 | 4849 | 4889 | 4891 | 4909 | 4911 | 4921 | 4009 | 4021 | 4011 |
| 320 | 4409 | 4411 | 4421 | 4441 | 4481 | 4809 | 4811 | 4821 | 4841 | 4881 |
| 330 | 4901 | 4402 | 4492 | 4802 | 4892 | 4912 | 4922 | 4012 | 4412 | 4422 |
| 340 | 4442 | 4482 | 4812 | 4822 | 4842 | 4882 | 4902 | 4404 | 4408 | 4410 |
| 350 | 4420 | 4804 | 4808 | 4810 | 4820 | 4924 | 4424 | 4444 | 4448 | 4484 |
| 360 | 4488 | 4490 | 4824 | 4844 | 4848 | 4884 | 4888 | 4890 | 4904 | 4908 |
| 370 | 4910 | 4920 | 4010 | 4008 | 4440 | 4480 | 4840 | 4880 | 4900 | 9109 |
| 380 | 9111 | 9121 | 9209 | 9211 | 9221 | 9241 | 9009 | 9011 | 9021 | 9041 |
| 390 | 9081 | 9101 | 9201 | 9249 | 9092 | 9112 | 9122 | 9212 | 9222 | 9242 |

FIG.4A

| ADDRESS | CONTENTS OF TABLE (HEXADECIMAL) | | | | | | | | | |
|---|---|---|---|---|---|---|---|---|---|---|
| (DECIMAL) | 0 | 1 | 2 | 3 | 4 | 5 | 6 | 7 | 8 | 9 |
| 400 | 9012 | 9022 | 9042 | 9082 | 9102 | 9202 | 9004 | 9008 | 9010 | 9020 |
| 410 | 8108 | 9224 | 8090 | 9248 | 9048 | 9084 | 9088 | 9090 | 9104 | 9108 |
| 420 | 9110 | 9120 | 9204 | 9208 | 9210 | 9220 | 9040 | 9080 | 9100 | 9240 |
| 430 | 8449 | 8489 | 8491 | 8909 | 8911 | 8921 | 8201 | 8011 | 8021 | 8041 |
| 440 | 8401 | 9091 | 8801 | 9049 | 8081 | 8409 | 8411 | 8221 | 8241 | 8481 |
| 450 | 8901 | 8209 | 8049 | 8441 | 8841 | 8089 | 8492 | 8912 | 8922 | 8012 |
| 460 | 8022 | 8042 | 8402 | 9002 | 8802 | 8082 | 8412 | 8422 | 8442 | 8482 |
| 470 | 8902 | 8212 | 8842 | 8092 | 8204 | 8208 | 8110 | 8120 | 8924 | 8220 |
| 480 | 8044 | 8048 | 8420 | 8404 | 8210 | 8084 | 8088 | 8410 | 8824 | 8844 |
| 490 | 8848 | 8884 | 8888 | 8890 | 8904 | 8908 | 8910 | 8920 | 8224 | 8248 |
| 500 | 8010 | 8020 | 8424 | 8448 | 8490 | 8124 | 8840 | 8880 | 8900 | 8040 |
| 510 | 8100 | 8080 | 8091 | 8122 | 9024 | 8024 | 8811 | 8881 | 8109 | 8211 |
| 520 | 8809 | 8849 | 9089 | 8891 | 8101 | 8889 | 8249 | 8242 | 8882 | 8112 |
| 530 | 8222 | 8892 | 8102 | 8202 | 8444 | 9044 | 8484 | 8488 | 8244 | 8104 |
| 540 | 8820 | 8804 | 8808 | 8240 | 8480 | 8440 | | | | |

FIG.4B

| State | Thresholds (decimal) | | Prefixes (binary) | | |
|---|---|---|---|---|---|
| | T1 | T2 | $0 \leq b < T1$ | $T1 \leq b < T2$ | $T2 \leq b < 256$ |
| S0 | 000 | 001 | $\phi$ | 01 or 00 | 00 |
| S1 | 004 | 123 | 01 | 01 or 00 | 00 |
| S2-5 | 034 | 050 | 10 or 01 | 01 | 01 or 00 |
| S6-8 | 034 | 174 | 10 or 01 | 01 | 01 or 00 |

FIG. 6

| Last runlength of previous codeword | L.s.b. of previous input byte | Current state |
|---|---|---|
| 0 | $\phi$ | S0 |
| 1 | $\phi$ | S1 |
| 2, 3, 4, 5, or 6 | 0 | S2-6a |
| 2, 3, 4, 5, or 6 | 1 | S2-6b |
| 7 or 8 | $\phi$ | S2-6b |

FIG. 8

| State | Thresholds (decimal) | | Prefixes (binary) | | |
|---|---|---|---|---|---|
| | T1 | T2 | $0 \leq b < T1$ | $T1 \leq b < T2$ | $T2 \leq b < 256$ |
| S0 | 000 | 000 | $\phi$ | $\phi$ | 00 |
| S1 | 002 | 120 | 01 | 01 or 00 | 00 |
| S2-6a | 036 | 036 | 01 | 01 or 00 | 00 |
| S2-6b | 036 | 039 | 10 | 10 or 01 | 01 |

FIG. 9

| ADDRESS | CONTENTS OF TABLE (HEXADECIMAL) | | | | | | | | | |
|---|---|---|---|---|---|---|---|---|---|---|
| (DECIMAL) | 0 | 1 | 2 | 3 | 4 | 5 | 6 | 7 | 8 | 9 |
| 0 | 0004 | 0004 | 0008 | 0008 | 0009 | 0011 | 0010 | 0010 | 0012 | 0021 |
| 10 | 0024 | 0024 | 0020 | 0020 | 0022 | 0041 | 0081 | 0049 | 0089 | 0091 |
| 20 | 0042 | 0082 | 0092 | 0080 | 0044 | 0044 | 0084 | 0084 | 0048 | 0048 |
| 30 | 0088 | 0088 | 0090 | 0090 | 0040 | 0040 | 0101 | 0102 | 0202 | 0201 |
| 40 | 0249 | 0109 | 0111 | 0121 | 0209 | 0211 | 0221 | 0241 | 0112 | 0122 |
| 50 | 0212 | 0222 | 0242 | 0100 | 0104 | 0104 | 0204 | 0204 | 0124 | 0124 |
| 60 | 0224 | 0224 | 0244 | 0244 | 0108 | 0108 | 0208 | 0208 | 0248 | 0248 |
| 70 | 0110 | 0110 | 0210 | 0210 | 0120 | 0120 | 0220 | 0220 | 0240 | 0240 |
| 80 | 0401 | 0449 | 0489 | 0491 | 0409 | 0411 | 0421 | 0441 | 0481 | 0809 |
| 90 | 0402 | 0492 | 0412 | 0422 | 0442 | 0482 | 0812 | 0480 | 0404 | 0404 |
| 100 | 0424 | 0424 | 0444 | 0444 | 0484 | 0484 | 0408 | 0408 | 0448 | 0448 |
| 110 | 0488 | 0488 | 0410 | 0410 | 0490 | 0490 | 0420 | 0420 | 0440 | 0440 |
| 120 | 0801 | 0849 | 0889 | 0891 | 0909 | 0911 | 0921 | 1001 | 1049 | 1089 |
| 130 | 1091 | 1109 | 1111 | 1121 | 1209 | 1211 | 1221 | 1241 | 0811 | 0821 |
| 140 | 0841 | 0881 | 0901 | 1009 | 1011 | 1021 | 1041 | 1081 | 1101 | 1201 |
| 150 | 1249 | 0802 | 0892 | 0912 | 0922 | 1002 | 1092 | 1112 | 1122 | 1212 |
| 160 | 1222 | 1242 | 0822 | 0842 | 0882 | 0902 | 1012 | 1022 | 1042 | 1082 |
| 170 | 1102 | 1202 | 0880 | 0900 | 1080 | 1100 | 0804 | 0804 | 0924 | 0924 |
| 180 | 1004 | 1004 | 1124 | 1124 | 1224 | 1224 | 1244 | 1244 | 0824 | 0824 |
| 190 | 0844 | 0844 | 0884 | 0884 | 0904 | 0904 | 1024 | 1024 | 1044 | 1044 |
| 200 | 1084 | 1084 | 1104 | 1104 | 1204 | 1204 | 0808 | 0808 | 1008 | 1008 |
| 210 | 1248 | 1248 | 0848 | 0848 | 0888 | 0888 | 0908 | 0908 | 1048 | 1048 |
| 220 | 1088 | 1088 | 1108 | 1108 | 1208 | 1208 | 0810 | 0810 | 1010 | 1010 |
| 230 | 0890 | 0890 | 0910 | 0910 | 1090 | 1090 | 1110 | 1110 | 1210 | 1210 |
| 240 | 0820 | 0820 | 0840 | 0840 | 1020 | 1020 | 1040 | 1040 | 0920 | 0920 |
| 250 | 1120 | 1120 | 1220 | 1220 | 1240 | 1240 | 2004 | 2004 | 2008 | 2008 |
| 260 | 2009 | 2011 | 2010 | 2010 | 2012 | 2021 | 2024 | 2024 | 2020 | 2020 |
| 270 | 2022 | 2041 | 2081 | 2001 | 2049 | 2089 | 2042 | 2082 | 2002 | 2080 |
| 280 | 2044 | 2044 | 2084 | 2084 | 2048 | 2048 | 2088 | 2088 | 2090 | 2090 |
| 290 | 2040 | 2040 | 2101 | 2102 | 2202 | 2201 | 2249 | 2091 | 2109 | 2111 |
| 300 | 2121 | 2209 | 2211 | 2221 | 2092 | 2112 | 2122 | 2212 | 2222 | 2100 |
| 310 | 2104 | 2104 | 2204 | 2204 | 2124 | 2124 | 2224 | 2224 | 2244 | 2244 |
| 320 | 2108 | 2108 | 2208 | 2208 | 2248 | 2248 | 2110 | 2110 | 2210 | 2210 |
| 330 | 2120 | 2120 | 2220 | 2220 | 2240 | 2240 | 2401 | 2449 | 2489 | 2491 |
| 340 | 2241 | 2409 | 2411 | 2421 | 2441 | 2481 | 2402 | 2492 | 2242 | 2412 |
| 350 | 2422 | 2442 | 2482 | 2480 | 2404 | 2404 | 2424 | 2424 | 2444 | 2444 |
| 360 | 2484 | 2484 | 2408 | 2408 | 2448 | 2448 | 2488 | 2488 | 2410 | 2410 |
| 370 | 2490 | 2490 | 2420 | 2420 | 2440 | 2440 | 4009 | 4011 | 4021 | 4041 |
| 380 | 4081 | 4101 | 4201 | 4249 | 4401 | 4449 | 4489 | 4491 | 4801 | 4849 |
| 390 | 4889 | 4891 | 4909 | 4911 | 4049 | 4089 | 4091 | 4109 | 4111 | 4121 |
| 400 | 4209 | 4211 | 4221 | 4241 | 4409 | 4411 | 4421 | 4012 | 4022 | 4042 |

FIG.7A

| ADDRESS | CONTENTS OF TABLE (HEXADECIMAL) | | | | | | | | | |
|---------|------|------|------|------|------|------|------|------|------|------|
| (DECIMAL) | 0 | 1 | 2 | 3 | 4 | 5 | 6 | 7 | 8 | 9 |
| 410 | 4082 | 4102 | 4202 | 4402 | 4492 | 4802 | 4892 | 4912 | 4002 | 4092 |
| 420 | 4112 | 4122 | 4212 | 4222 | 4242 | 4412 | 4422 | 4442 | 4480 | 4880 |
| 430 | 4900 | 4080 | 4024 | 4024 | 4044 | 4044 | 4084 | 4084 | 4104 | 4104 |
| 440 | 4204 | 4204 | 4404 | 4404 | 4004 | 4004 | 4124 | 4124 | 4224 | 4224 |
| 450 | 4244 | 4244 | 4424 | 4424 | 4444 | 4444 | 4484 | 4484 | 4824 | 4824 |
| 460 | 4844 | 4844 | 4048 | 4048 | 4088 | 4088 | 4108 | 4108 | 4008 | 4008 |
| 470 | 4248 | 4248 | 4448 | 4448 | 4488 | 4488 | 4848 | 4848 | 4888 | 4888 |
| 480 | 4908 | 4908 | 4090 | 4090 | 4110 | 4110 | 4210 | 4210 | 4010 | 4010 |
| 490 | 4490 | 4490 | 4890 | 4890 | 4910 | 4910 | 4120 | 4120 | 4220 | 4220 |
| 500 | 4240 | 4240 | 4420 | 4420 | 4440 | 4440 | 4020 | 4020 | 4040 | 4040 |
| 510 | 4920 | 4920 | 4804 | 4804 | 4208 | 4208 | 4441 | 4481 | 4410 | 4410 |
| 520 | 4482 | 4809 | 4884 | 4884 | 4820 | 4820 | 4812 | 4811 | 4901 | 4841 |
| 530 | 4881 | 4921 | 4882 | 4902 | 4922 | 4100 | 4904 | 4904 | 4924 | 4924 |
| 540 | 4408 | 4408 | 4808 | 4808 | 4810 | 4810 | 4840 | 4840 | 4821 | 4822 |
| 550 | 4842 | | | | | | | | | |

FIG.7B

| First runlength in next codeword | Second runlength in next codeword | Decoded bit |
|---|---|---|
| 2 or more | φ | 0 |
| 1 | 5 or more | 0 |
| 1 | 2, 3, or 4 | 1 |
| 0 | φ | 1 |

FIG. 10

| Last runlength of previous codeword | L.s.b. of previous input byte | Current state |
|---|---|---|
| 0 | φ | S0 |
| 1 | φ | S1 |
| 2 | 0 | S2a |
| 3 | 0 | S3a |
| 4 | 0 | S4a |
| 5 or 6 | 0 | S5-6a |
| 2, 3, 4, 5, or 6 | 1 | S2-6b |
| 7, 8 | φ | S7-8 |

FIG. 11

| State | Thresholds (decimal) | | Prefixes (binary) | | |
|---|---|---|---|---|---|
| | T1 | T2 | $0 \leq b < T1$ | $T1 \leq b < T2$ | $T2 \leq b < 256$ |
| S0 | 000 | 000 | φ | φ | 00 |
| S1 | 002 | 120 | 01 | 01 or 00 | 00 |
| S2a | 005 | 036 | 01 | 01 or 00 | 00 |
| S3a | 009 | 036 | 01 | 01 or 00 | 00 |
| S4a | 015 | 036 | 01 | 01 or 00 | 00 |
| S5-6a | 036 | 036 | 01 | 01 or 00 | 00 |
| S2-6b | 036 | 039 | 10 | 10 or 01 | 01 |
| S7-8 | 039 | 080 | 10 or 01 | 01 | 01 or 00 |

FIG. 12

| State deleted | Redirection required to state |
|---|---|
| S2a | S3a, S4a, or S5-6a |
| S3a | S4a or S5-6a |
| S4a | S5-6a |
| S7-8 | S2-6b |

| Encoding level | States deleted | Percentage of bytes with DC control |
|---|---|---|
| Level-8 | None | 12.2% |
| Level-7 | S4a | 11.8% |
| Level-6 | S3a and S4a | 11.0% |
| Level-5 | S2a, S3a, and S4a | 9.7% |
| Level-4 | S2a, S3a, S4a, and S7-8 | 7.6% |

$$A_G^{15} = \begin{bmatrix} 59 & 40 & 28 & 19 & 13 & 9 & 6 & 4 & 3 & 2 & 1 & 1 & 1 \\ 87 & 59 & 40 & 28 & 19 & 13 & 9 & 6 & 4 & 3 & 2 & 1 & 1 \\ 126 & 87 & 59 & 40 & 28 & 19 & 13 & 9 & 6 & 4 & 3 & 2 & 1 \\ 125 & 86 & 59 & 40 & 27 & 19 & 13 & 9 & 6 & 4 & 3 & 2 & 1 \\ 124 & 85 & 58 & 40 & 27 & 18 & 13 & 9 & 6 & 4 & 3 & 2 & 1 \\ 122 & 84 & 57 & 39 & 27 & 18 & 12 & 9 & 6 & 4 & 3 & 2 & 1 \\ 119 & 82 & 56 & 38 & 26 & 18 & 12 & 8 & 6 & 4 & 3 & 2 & 1 \\ 115 & 79 & 54 & 37 & 25 & 17 & 12 & 8 & 5 & 4 & 3 & 2 & 1 \\ 109 & 75 & 51 & 35 & 24 & 16 & 11 & 8 & 5 & 3 & 3 & 2 & 1 \\ 100 & 69 & 47 & 32 & 22 & 15 & 10 & 7 & 5 & 3 & 2 & 2 & 1 \\ 87 & 60 & 41 & 28 & 19 & 13 & 9 & 6 & 4 & 3 & 2 & 1 & 1 \\ 68 & 47 & 32 & 22 & 15 & 10 & 7 & 5 & 3 & 2 & 2 & 1 & 0 \\ 40 & 28 & 19 & 13 & 9 & 6 & 4 & 3 & 2 & 1 & 1 & 1 & 0 \end{bmatrix}$$

FIG. 16

$$A_H = \begin{bmatrix} 59 & 40 & 28 & 19 & 13 & 15 & 7 \\ 87 & 59 & 40 & 28 & 19 & 13 & 10 \\ 126 & 87 & 59 & 40 & 28 & 32 & 15 \\ 125 & 86 & 59 & 40 & 27 & 32 & 15 \\ 124 & 85 & 58 & 40 & 27 & 31 & 15 \\ 119 & 82 & 56 & 38 & 26 & 30 & 14 \\ 109 & 75 & 51 & 35 & 24 & 27 & 13 \end{bmatrix}$$

FIG. 17

| State | Stationary probability | DC control |
|---|---|---|
| S0 | 0.2305 | 0 |
| S1 | 0.1563 | 0.4609 |
| S2a | 0.1094 | 0.1211 |
| S3a | 0.0742 | 0.1055 |
| S4a | 0.0508 | 0.0820 |
| S5-6a | 0.0586 | 0 |
| S2-6b | 0.2930 | 0.0117 |
| S7-8 | 0.0273 | 0.7773 |

$$D_E = \begin{bmatrix} 0 & 0 & 0 & 0 & 0 & 0 & 0 & 0 \\ 28 & 19 & 12 & 9 & 6 & 7 & 34 & 3 \\ 7 & 5 & 3 & 2 & 2 & 2 & 9 & 1 \\ 6 & 4 & 3 & 2 & 1 & 2 & 8 & 1 \\ 5 & 3 & 2 & 2 & 1 & 1 & 6 & 1 \\ 0 & 0 & 0 & 0 & 0 & 0 & 0 & 0 \\ 1 & 2 & 0 & 0 & 0 & 0 & 0 & 0 \\ 48 & 35 & 22 & 14 & 9 & 11 & 56 & 4 \end{bmatrix}$$

FIG. 19

METHOD AND APPARATUS FOR GENERATING RUNLENGTH-LIMITED CODING WITH DC CONTROL

BACKGROUND OF THE INVENTION

This invention relates to a system for encoding binary data words into codewords that satisfy prescribed constraints for transmission and thereafter for decoding the codewords into the original binary data words. In particular, this invention relates to a system of encoding and decoding data which increases information density, minimizes the overall DC component of the transmitted digital code, and minimizes the memory required for the coding table.

In digital transmission systems and in magnetic and optical recording/playback systems, the information to be transmitted or to be recorded is presented as a bit stream sequence of ones and zeros. In optical and magnetic recording systems, the bit stream written into the device must satisfy certain constraints. A common family of constraints are the (d,k) runlength-limited (RLL) constraints, which specify that the run of zeros between consecutive ones in the bit stream must have a length of at least d and a length of no more than k for the prescribed parameters d and k. Currently, it is common for a compact disk to use a code with the constraint (d,k)=(2,10). An example of a sequence satisfying the (2,10) constraint is . . . 000100000000000100100000100. . . in which the first four runlengths are 3, 10, 2 and 5.

Magnetic recording standards include the (1,7)-RLL constraint and the (1,3)-RLL constraint.

The set of all sequences satisfying a given (d,k)-RLL constraint can be described by reading the labels off of paths in the labeled directed graph as shown in FIG. 1. The parameter k is imposed to guarantee sufficient sign changes in the recorded waveform which are required for clock synchronization during read-back. The parameter d is required to prevent inter-symbol interference.

Another type of constraint requires controlling the low frequency or DC constant of the input data stream. The DC control is used in optical recording to avoid problems such as interference with the servo system and to allow filtering of noise resulting from finger-prints. Information channels are not normally responsive to direct current and any DC component of the transmitted or recorded signal is likely to be lost. Thus, the DC component of the sequence of symbols should be kept as close to zero as possible, preferably at zero. This can be achieved by requiring the existence of a positive integer B such that any recorded sequence $w_1 w_2 \ldots w_l$ now regarded over the symbol alphabet $\{+1,-1\}$ will satisfy the inequality $$\left| \sum_{h=i}^{j} w_h \right| \leq B$$

for every $1 \leq i \leq j \leq l$. Sequences that obey these conditions are said to satisfy the B-charge constraint. The larger the value of B, the less reduction there will be in the DC component.

However, in certain applications, the charge constraint can be relaxed, thus allowing higher coding rates. In such applications, the DC control may be achieved by using a coding scheme that allows a certain percentage of symbols (on the average) to reverse the polarity of subsequent symbols. Alternatively, DC control may be achieved by allowing a certain percentage of symbols on average to have alternate codewords with a DC component which is lower or of opposite polarity.

DC control and (d,k)-RLL constraints can be combined. In such schemes, the constraint of binary sequences $z_1 z_2 z_3 \ldots z_l$ that satisfy the (d,k)-RLL constraint, such that the respective NRZI sequences $$(-1)^{z_1}(-1)^{z_1+z_2}(-1)^{z_1+z_2+z_3} \ldots$$

have a controlled DC component.

Referring to FIG. 2 shows a functional block diagram of a conventional encoding/decoding system 200. In a typical example of audio data recorded onto a CD, analog audio data from the left and right speakers 202a, 202b of a stereo system are converted into 8 bit signal which is input into a data scrambler and error correction code generator whose output 210 is transmitted into an encoder 212 comprised of a channel encoder 214 and a parallel-to-serial converter 216. The serial data 220 is written to a compact disk 222. A similar process is used to decode data from the CD. Data 224 from the CD is input into a decoder 230 comprised of a serial to parallel converter 230 and a channel decoder 232. Data from the CD is decoded, input into an error corrector and descrambler 238 and output as audio data 240.

The encoder 212 is a uniquely-decodable (or lossless) mapping of an unconstrained data stream into a constrained sequence. The current standard for encoding compact disk data is eight-to-fourteen modulation (EFM). Using EFM encoding, blocks of 8 data bits are translated into blocks of 14 data bits, known as channel bits. EFM uses a lookup table which assigns an unambiguous codeword having a length of 14 bits to each 8-bit data word. By choosing the right 14-bit words, bit patterns that satisfy the (2,10) constraint, high data density can be achieved. Three additional bits called merge bits are inserted between the 14 bit codewords. These three bits are selected to ensure the (2,10) constraint is maintained and also to control the low frequency or DC content of the bit stream. The addition of these three merge bits makes the effective rate of this coding scheme 8:17 (not 8:14).

Demands for higher data density are increasing with the advent of multimedia, graphics-intensive computer applications and high-quality digital video programming. A proposal described in the article "EFMPlus: The Coding Format of the MultiMedia Compact Disc", Proc. 16th Symp. on Inform. Theory in the Benelux, Nieuwerkerk a/d Yssel, May 18–19, 1995, describes an encoding/decoding system which increases data density compared to EFM coding. In the system proposed in the EFMPlus article, both the encoder and decoder for constrained data take the form of a finite-state machine. A rate p:q finite-state encoder accepts an input block of p-bits and generates a q-bit codeword depending on the input block and the current state of the encoder. The sequences obtained by concatenating the generated q-bit codewords satisfy the constraint. In optical storage devices, the p-bit input block is typically taken to be an 8 bit byte so that it matches the unit size used in the error-correction scheme.

The proposed EFMPlus scheme is a rate 8:16 finite state encoder for the (2,10)-RLL constraint which increases its data density compared to the EFM scheme. The encoder is however a more complex four state encoder with each state requiring 256+88 sixteen bit codewords. (The 88 codewords are alternate codewords which are used to control the DC content.)

A method and apparatus of encoding and decoding binary data which increases information density, minimizes the overall DC component of the transmitted digital code, and minimizes the memory required for the encoding and decoding tables is needed.

SUMMARY OF THE INVENTION

The present invention describes a lossless coding scheme that maps unconstrained binary sequences into sequences that obey the (d,k)-RLL constraint while offering a degree of DC control. The lossless coding scheme provides a method and apparatus for encoding and decoding binary data which increases information density relative to EFM coding and minimizes the overall DC component of the output constrained sequences. Further, the coding scheme attempts to minimize the memory required for the encoding and decoding tables. Memory size is decreased compared to the EFM coding scheme.

In the preferred embodiment, the channel encoder is a state machine which uses a single "overlapping" table for all states rather than using multiple tables. Recognizing that a subset of codewords in a first state $x_1$ are identical to a subset of codewords in the second state $x_j$, the overlapping encoding table uses identical addresses for the subset of identical codewords in the first and second state. Thus addresses for more than one state may point to a single codeword. A number of input bytes can be encoded into two different codewords which have different parity of ones, thus allowing for DC control. Decoding is carried out in a state-independent manner.

The encoder is a finite-state machine that maps input blocks to codewords. The encoder design is based on a method of choosing codewords and their sequence using state splitting, state merging and state deletion techniques such that a single table may be constructed for mapping unconstrained binary sequences into sequences that obey a (d,k) runlength constraint (here with d=2 and k=10, or 12) and a fixed-rate (either 8:15 or 8:16). The encoder is a finite-state machine consisting of four or more states. The encoder can achieve DC Offset control by choosing between output codewords with opposite "parity."

The main building block of the encoder is a table of codewords that serves all states. It has a simple addressing scheme for selection of a codeword or its opposite parity codeword, which simplifies the address circuitry. Encoding is carried out by prefixing the input block with a fixed number of bits (two bits in the provided examples) which depend on the input block as well as the current encoder state. The result is an address to the table from which the current encoded codeword is taken. Assuming random input, the probability of being at any given state is independent of the previous state, which allows advantage to be taken of the statistical randomness of the data.

The encoder features DC control by allowing for a number of input blocks to have two possible encoded codewords. The parity (number of 1's) is different in the two possible codewords and so the respective NRZI sequences end with a different polarity, thus allowing the reversal of the polarity of subsequent codewords. The ability to replace codewords with codewords of opposite polarity allows control of the accumulating DC offset. Since the "final bits" or "final run" of all codewords and their opposite parity codewords are matched, subsequent encoding is not affected by which is chosen (a codeword or its opposite parity mate). This facilitates using "look ahead" to optimize DC control. In those cases where DC control is possible, the address of the alternate codeword is obtained by adding a fixed number ($2^8$ in the provided examples) to the computed address.

The encoder preferably has a sliding-block decoder which can be efficiently implemented using an associative memory which contains the encoder table. The current input block is recovered from the current codeword and, possibly, a prescribed number of subsequent codewords. In the first example, the input byte can be fully recovered from the address in the table where the current received codeword is located. In the second example, the most significant seven bits of the current input byte can be obtained in a similar manner. As for the least significant bit (LSB), it may be computed from the address as well, or depending on the current codeword, by determining which half of the table the next codeword is located in.

Error propagation can be limited by the use of sliding-block decoders. A sliding-block decoder makes a decision on a given received q-bit codeword on the basis of the local context of that codeword in the received sequence: the codeword itself, as well as a fixed number m of preceding codewords and a fixed number a of later codewords. Thus, a single error at the input to a sliding-block decoder can only affect the decoding of most m+a+1 consecutive codewords.

A further understanding of the nature and advantages of the present invention may be realized with reference to the remaining portions of the specification and the attached drawings.

BRIEF DESCRIPTION OF THE DRAWINGS

FIGS. 4A and 4B shows an encoding table for a (2,10)-RLL encoder according to the present invention.

FIG. 6 shows a table of threshold values and the table of prefixes for a (2,10)-RLL encoder.

FIGS. 7A and 7B shows an encoding table for a (2,12)-RLL encoder according to the present invention.

FIG. 8 shows the runlength next state dependency for a (2,10)-RLL Level-4 encoder according to the present invention.

FIG. 9 shows a table of threshold values and the table of prefixes for a (2,12)-RLL Level-4 encoder.

FIG. 10 shows the runlength next state dependency for a (2,12)-RLL Level-4 encoder.

FIG. 11 shows the runlength next state dependency for a (2,12)-RLL Level-8 encoder.

FIG. 12 shows a table of threshold values and the table of prefixes for a (2,12)-RLL Level-8 encoder.

FIG. 16 shows an adjacency matrix of G.

FIG. 17 shows an adjacency matrix of H.

FIG. 19 shows matrix $D_e$.

DETAILED DESCRIPTION OF THE PREFERRED EMBODIMENTS

The present invention provides a method and apparatus for encoding and decoding a sequence of input blocks each block comprised of p bits. The input blocks are encoded into a sequence of codewords each codeword comprised of q bits, the sequence of codewords satisfying a d-constraint such that consecutive bits of one type characterized by a transition are separated by at least d bits of another type characterized by an absence of a transition, and satisfying a k-constraint such that no more than a maximum of k bits of the other type occur between successive bits of the one type. The method of encoding includes the steps of: receiving a p bit input block; and converting each input block into a corresponding codeword of q serial bits using an encoder, the encoder including an encoding table, the encoding table being representative of a number of states $x_1, x_2 \ldots, x_n$.

In the present invention, the encoder is a state machine that uses a single "overlapping" table for all states rather than using multiple tables. Recognizing that a subset of codewords in a first state $x_i$ are identical to a subset of codewords in the second state $x_j$, the overlapping encoding table uses identical addresses for the subset of identical codewords in the first and second state. Thus the addresses of the subset of codewords in the first state are identical to the addresses for the subset of codewords in the second state.

Figure 2:
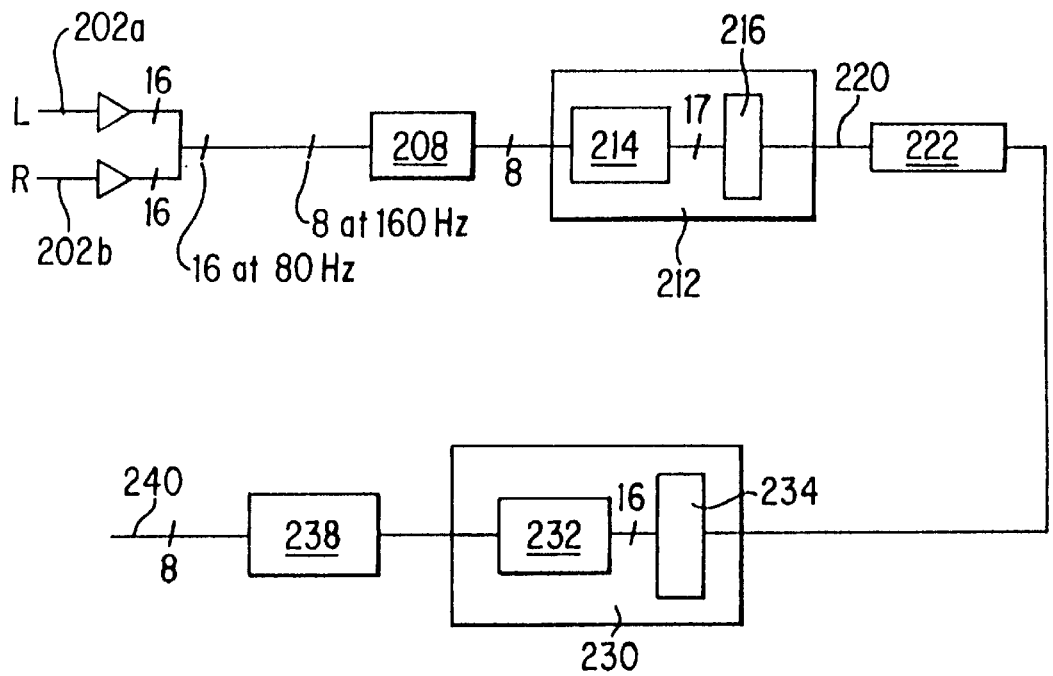
FIG. 2 shows a functional block diagram of a conventional encoding/decoding system.
Figure 1:
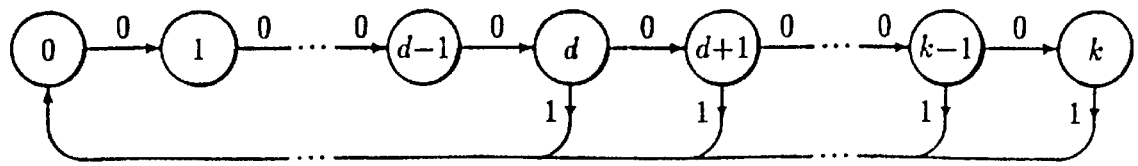
FIG. 1 shows a graphical representation of a (d,k)-RLL constraint.

The coding system of the present invention can be implemented according to a functional block diagram similar to that shown in FIG. 2 and similarly includes both a means for encoding and decoding a sequence of input blocks. However, differences such as the configuration of the encoding table and method of addressing into the encoding table are described in detail below. Although the encoding table is stored in memory and referred to as a "single" overlapping table, it is not required that the "single" table be stored in sequential memory addresses.

The following detailed description provides two examples utilizing the encoding and decoding system according to the present invention. The first example describes a four-state (2,10)-RLL encoder at rate 8:16, using a table of 546 codewords. The percentage of bytes that allow for DC control is 49.7%, on the average. Decoding is carried out by recovering the input byte from the current 16-bit codeword.

The second example describes a (2,12)-RLL encoder at rate 8:15, using a table of 551 codewords. The percentage of bytes that allow for DC control ranges between 7.6% and 12.2%, depending on the number of states of the encoder which, in turn, can range between four and eight. Decoding is carried out by recovering the input byte from the current, and possibly the next 15-bit codeword.

I. Coding Scheme for the (2,10)RLL Constraint

Figure 3:
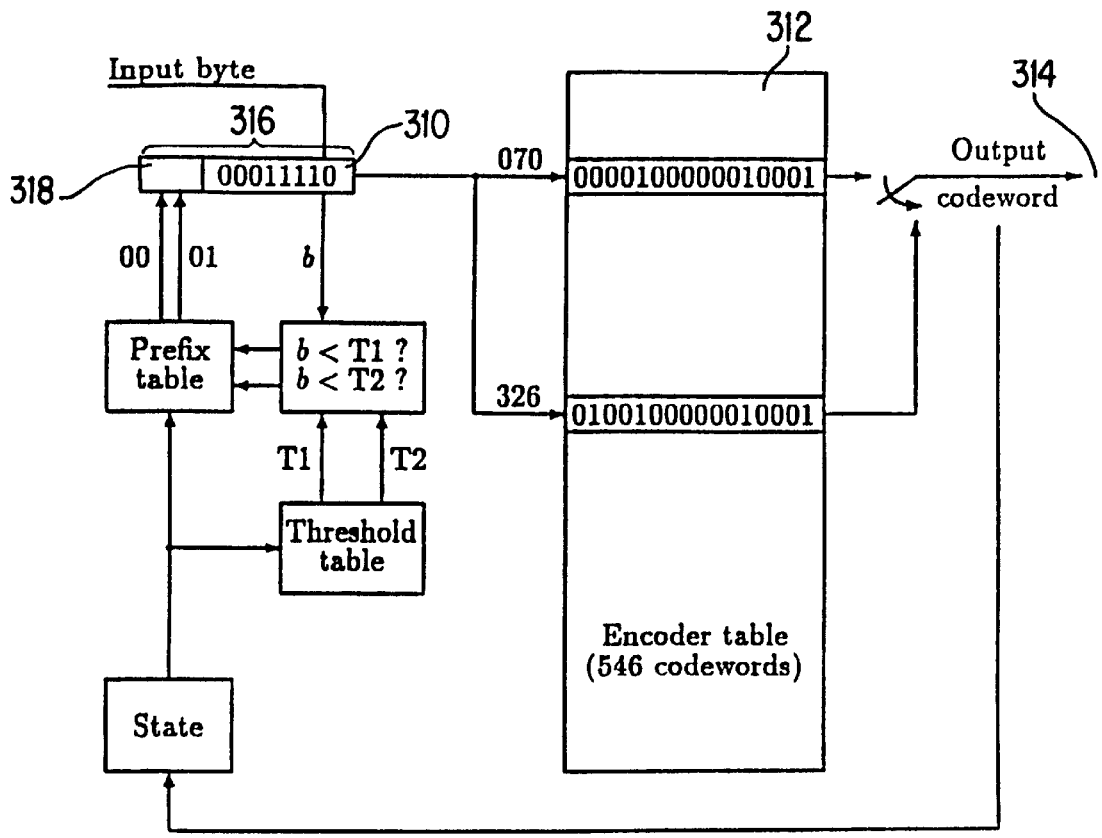
FIG. 3 shows a schematic diagram of a (2,10)-RLL encoder according to the present invention.

The following description is related to a coding scheme for a (2,10)-RLL constraint. FIG. 3, shows a schematic diagram of a (2,10)-RLL encoder 300. Referring to FIG. 3, shows an input byte 310 which is encoded using an encoding table 312 to an output codeword 314. The encoder can be in any one of $x_1, x_2 \ldots x_n$ states. In the preferred embodiment for a (2,10)-RLL constraint, n=4. Thus at each encoding step, the encoder 300 can be in one out of four states: S0, S1, S2-5, or S6-8. Each state is associated with a range of final runlengths which is reflected in the state name. For example, state S6-8 is associated with the runlengths 6, 7, and 8.

In the preferred embodiment, the (2,10)-RLL encoding table 312 consists of 546 codewords, each having 16 bits. FIGS. 4A and 4B show one possible encoding table 312 for a (2,10)-RLL encoder 300 according to the present invention. The codewords shown in FIGS. 4A and 4B are in hexadecimal form.

Figure 5:
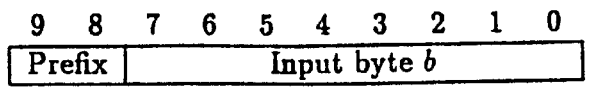
FIG. 5 shows the format of the address to the encoding table.

After receiving the p bit input block 310, the encoder 300 converts each input block 310 into a corresponding q bit codeword 314 using the encoding table 312. The address 316 of the encoding table 312 is determined by prefixing a predetermined value 318 having a fixed number of bits to the input block 310. FIG. 5 shows the format of an address to the encoding table 312. In the preferred embodiment, the predetermined prefix value 318 is a two bit value. Thus, a ten-bit address 316 is formed by prefixing two bits to the input block 310 resulting in an address as shown by FIG. 5.

The two-bit predetermined prefix value 318 depends on how the value of input block 310 (as an integer) compares with a first threshold value and a second threshold value, T1 (320a) and T2 (320b). These thresholds 320a, 320b, in turn, depend on the current state of the encoder 300.

FIG. 6 shows a table of threshold values and the table of prefixes for a (2,10)-RLL encoder. The notation "φ" stands here for the "don't care" sign. Referring to FIG. 6 for example, shows for a current state of S6-8, the input byte will be 038 (decimal) and the corresponding codeword address will be 256+038=294.

The output codeword 314 is the entry in encoding table 312 at the computed address. The next encoder state is the unique state with an associated runlength range that includes the last runlength of the generated codeword. The final runlength of the codeword determines the next state of the encoder. For the example shown in FIG. 3, the output codeword 314 is 0100001000010010 (4212 in hexadecimal notation) and the next encoder state is S1.

As can be seen in FIG. 6, there are cases where more than one prefix is possible, resulting in two different codeword candidates. Assuming random input, the percentage of bytes within an input sequence for which two codeword candidates exist is 49.7% on the average.

The encoding table 312 is designed so that those codeword candidates will have different parity of sign changes (namely, different parity of number of 1's), thus allowing for DC control. Furthermore, both codeword candidate choices lead the encoder to the same state and, therefore, replacement of a codeword with its alternate can be done within an output stream without affecting preceding or following codewords. For example, if the current state is S1 and the input is 70 (decimal), then the output codeword can be either 0000100000010001 or 0100100000010001. Both codewords lead to state S0. The decoder can recover the input byte regardless of the specific codeword candidate that was chosen.

In the preferred embodiment, the codeword candidates have different parity of sign change thus allowing for DC control. In an alternative embodiment, codeword candidates have DC components that are different and preferably of opposite sign thus allowing for DC control by choosing the codeword which reduces the accumulated DC.

The encoding table 312 shown in FIGS. 4A and 4B does not contain the (hexadecimal) words 8111, 8121, 8421, 8821, 8812, 8822, 9124, 9244, 8408, 8810, as well as none of the ten 16-bit words in the (2,10)-RLL constraint that end with a runlength of 9 or 10. Therefore, these words can be used for synchronization. By reducing the threshold 034 in FIGS. 4A and 4B, more codewords at the end of the encoding table 312 can be reserved for special use.

Decoding of the (2,10)-RLL system is carried out in a state-independent manner, using the encoding table 312 which is assumed to reside in an associative read-only memory. First, an address is found of a table entry that contains the received codeword. The input byte 310 is then obtained by truncating the two most significant bits (MSB's) of the address where the codeword is located.

II. Coding Scheme for the (2,12)RLL Constraint

The following example is related to a coding scheme a (2,12)-RLL constraint. The encoding algorithm has several encoding levels, depending on the acceptable number of states and the desirable DC control. In the basic level (referred to as Level-4), the encoder has four states (n=4) and DC control is possible in 7.6% of the input bytes, on the average. Extended levels are obtained by adding more states, reaching eight states (n=8) in the Level-8 encoder. The extended level (n=8) allows for DC control in 12.2% of the input bytes, on the average.

The encoder structure for Level-4 (2,12)-RLL constraint is as shown in FIG. 3. However, instead of using the encoder table of FIGS. 4A and 4B, the encoder table of FIGS. 7A and 7B is used. FIGS. 7A and 7B is an encoder table for a (2,12)-RLL constraint. The encoder table in FIGS. 7A and 7B consist of 551 codewords, each of length 15 bits. The encoder table 312 can be divided into two sections: The first section contains the first 292 codewords, and the second contains the remaining 259 codewords.

For n=4, the encoder can be in one out of four states: S0, S1, S2-6a, or S2-6b. The specific state depends on the last runlength of the previous codeword and the LSB of the previous input byte. The runlength state dependency for the (2,12)-RLL encoder according to the present invention is shown in FIG. 8.

Similar to the (2,10)-RLL encoder previously described, encoding is carried out by comparing the input byte b to threshold values and adding suitable two-bit prefixes. The threshold values and the prefixes for a (2,12) encoder are shown in FIG. 9. A threshold T1 (respectively, T2) for a state S will be denoted hereafter by T1 (S) (respectively, T2(S)).

The output codeword is the entry in FIGS. 7A and 7B at the computed address. The next encoder state is determined by FIG. 8. DC control is attained by allowing certain input bytes to have two different codeword candidates. Assuming random input, the percentage of such input bytes within an input sequence is 7.6% on the average.

If T2(S2-6b) is changed to 036, then the codewords at addresses 548, 549, and 550 will never be used. In addition, the encoder table does not contain any of the ten 15-bit words in the (2,12)-RLL constraint that end with a runlength of 9 or more. This makes all those words available for synchronization. Alternatively, T2(S2-6a) and T1(S2-6b) can be increased to any (same) value between 036 and T2(S2-6b).

Similar to the (2,10)-RLL decoder previously described, decoding is carried out in a state-independent manner, using the encoding table. First, an address is found of a table entry that contains the received codeword. If the codeword ends with a runlength of 0, 1, 7, or 8, then that codeword appears only once in the table. In this case, the input byte is obtained by truncating the two MSB's of the address where the codeword is located.

In case the codeword ends with a runlength of 2, 3, 4, 5, or 6, then it appears twice in the encoder table, in two adjacent locations, the first of which has an even address (therefore, the two addresses differ in their LSB only). By truncating the two MSB's of the address, all the bits of the input byte, with the exception of its LSB, are determined. In order to recover the LSB of the input byte, the next received codeword is found in the encoder table 312. If it is located in the first section of the encoder table shown in FIGS. 7A and 7B (i.e., at an address smaller than 292), then the LSB of the input byte is 0. Otherwise, it is 1.

Alternatively, when the received codeword ends with a runlength of 2, 3, 4, 5, or 6, the criterion for determining the LSB of the input byte can be modified provided that the following changes are made: (a) increase T2(S2-6a) and TI(S2-6b) to 038, and (b) switch between the table contents at the following address pairs: 036<->041, 037<->048, 292<->297, and 293 <->304. With those changes, the LSB of the current input byte can be determined by the first and second runlengths of the next codeword according to table shown in FIG. 10, whenever the current codeword ends with a runlength of 2 through 6.

Alternatively, the levels of encoding may be extended. The following example describes a (2,12)-RLL coding having eight states. The advantage of using extended levels of encoding is having more input bytes, on the average, where DC control is possible, at the expense of increasing the number of states of the encoder. Assuming random input, the percentage of input bytes which have two codeword candidates reaches 12.2% on the average, compared to 7.6% in Level-4.

Level-8 is an extended encoding level in which the decoder has eight states. Each state is determined by the last runlength of the previous codeword and the LSB of the previous input byte as can be seen in the table shown in FIG. 11. Encoding is carried out by comparing the input byte b to threshold values and adding suitable prefixes, according to the table shown in FIG. 12.

The last three codewords in the encoder table can be used for synchronization if T2(S2-6a) and T1(S7-8) are changed to 036.

There are 215 input bytes at state S7-8 for which two output codewords are possible. In each such pair, both codewords lead to the same encoder state, and all but 16 pairs allow for DC control (namely, there are 16 pairs where the two codewords have the same parity of number of 1's). In all other states, all replacement codewords allow for DC control.

Figures 13, 14, 15:
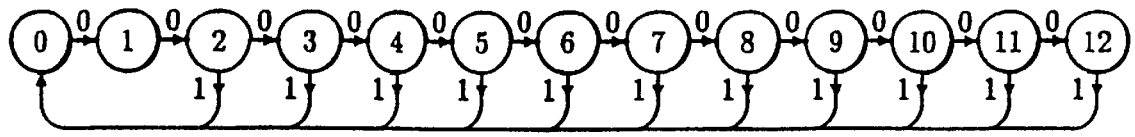
FIG. 13 summarizes the states that can be deleted and the redirection required.
FIG. 14 summarizes the percentage of random input bytes, on the average, for which DC control is possible.
FIG. 15 shows a graphical presentation of the (2,12)-RLL constraint.

Some states in Level-8 can be deleted, thus generating lower encoding levels. When a state is deleted, the codewords that led the encoder to that state need to be redirected into another state. The states that can be deleted and the redirection required are summarized in the table shown in FIG. 13. In particular, the Level-4 (2,12)-RLL encoder previously described is obtained by deleting states S2a, S3a, S4a, and S7-8, in which case state S5-6a becomes state S2-6a. FIG. 14 summarizes the percentage of random input bytes, on the average, for which DC control is possible, for certain configurations of deletion of states.

The decoder described for the (2,12)-RLL can be used as is for extended encoding levels as well. The criteria for determining the LSB of the input byte can be similarly modified, except that now all thresholds T2 equaling 036 in FIG. 12, as well as T1(S2-6b), need to be changed to 038.

III. Code Design

In this section, we outline the principles that guided the design of the coding and encoding systems previously discussed. Before the step of converting each input block into a corresponding codeword, the encoder table must be defined. Although various design methodologies may be used, in the preferred methodology the codewords are defined by the following steps: determining the adjacency matrix $A_G$; computing an approximate eigenvector of the adjacency matrix $A_G$; deleting states with zero weight; merging at least a subset of the states having the same weight; responsive to the deleted states and merged states, determining a new adjacency matrix $A_H$; and reducing the number of encoder states.

The following is a description of the design methodology for a (2,12)-RLL constraint. The first step in the design methodology is the step of determining the adjacency matrix $A_G$. Let G denote the graph presentation of the (2,12)-RLL constraint which is shown in FIG. 15. The adjacency matrix of G, shown in FIG. 16 and denoted $A_G$, is a 13×13 matrix whose rows and columns are indexed by the states (vertices) of G and the (u,v)th entry of $A_G$, denoted $(A_G)_{u,v}$ equals the number of edges from state u to state v in G. That is, for $0 \leq u, v \leq 12$, $$(A_G)_{u,v} = \begin{cases} 1 & \text{if } v = u + 1 \\ 1 & \text{if } 2 \leq u \leq 12 \text{ and } v = 0 \\ 0 & \text{otherwise} \end{cases}$$

The graph $G^q$ is obtained from G in the following manner. The set of states of $G^q$ is the same as that of G, and each edge in $G^q$ corresponds to a path of length q in G, beginning at the initial state of the first edge of the path in G and ending at the terminal state of the last edge of the path in G. The label of an edge in $G^q$ is the word generated by the respective path in G. The adjacency matrix of $G^q$ equals $(A_G)^q$. For q=15 we get the matrix in FIG. 16.

A. State Merging and State Splitting

To obtain a rate 8:15 finite-state encoder, we first invoke the technique of state splitting which is described in the references "Algorithms for sliding block codes—an application of symbolic dynamics to information theory," Adler et al., IEEE Trans. Inform.Theory, 29 (1983), 5–22, "Constrained systems and coding for recording channels," Marcus et al. to appear in Handbook of Coding Theory, R. A. Brualdi, W. C. Huffman, V. Pless (Eds.), Elsevier, Amsterdam, and also appeared as TR 839, Computer Science Department, Technion, Haifa, Israel, December 1994, and "Finite-state modulation codes for data storage," IEEE J. Sel. Areas Comm., 10 (1992), 5–37. We start by computing an $(A_G^{15}, 2^8)$ approximate eigenvector, which is a nonnegative nonzero integer vector $x=[x_u]_{u=0}^{12}$ such that $A_G^{15} x \geq 2^8 x$, where the inequality holds component by component. The entry $x_u$ is referred to as the weight of state u. An $(A_G^{15}, 2^8)$-approximate eigenvector with components adding up to the smallest sum possible is given by $$x=[1122222110000]^T$$

In particular, any $(A_G^{15}, 2^8)$-approximate eigenvector must contain a component which is greater than 1. It follows that there is no finite-state encoder for the (2,12)-RLL constraint at rate 8:15 that has a sliding-block decoder with m=a=0. The encoder we construct has a sliding-block decoder with m=0 and a=1. Furthermore, seven bits of the current input byte can be determined from the current received codeword alone. The LSB of the current input byte is the only bit which may require the next received codeword for decoding. (We remark that in the case of the (2,10)-RLL constraint, there is an approximate eigenvector which is a 0–1 vector. Indeed, in this case, we have managed to obtain a sliding-block decoder with m=a=0. Such encoders are called block decodable.

After the step of computing an approximate eigenvector, states having zero weight are deleted and states having the same weight are merged. States 9 through 12 have zero weight and therefore can be removed from $G^{15}$ with all their incoming and outgoing edges. States 7 and 8 have the same weight and, in addition, all words that can be generated by paths beginning at state 8 in $G^{15}$ can also be generated starting at state 7. Therefore, state 7 can be merged into state 8 by redirecting edges incoming to state 7 so that they terminate in state 8, thereby allowing the deletion of state 7.

Similarly, states 2 through 5 can be merged into state 6. Indeed, when doing so, we will end up with the Level-5 encoder which is defined in FIG. 14. To obtain the Level-8 encoder, we merge only state 5 into state 6. (The same applies with respect to the (2,10) encoder previously described: we could merge states 2 through 7 into state 8 to obtain a (2,10)-RLL encoder with three states; however, to gain more DC control, we merged states 2 through 4 into state 5 and states 6 and 7 into state 8, resulting in four states altogether).

After merging and deleting states, we obtain a graph H with the following seven states: S0, S1, S2, S3, S4, S5-6, and S7-8. States S0 through S4 correspond to states 0 through 4 in $G^{15}$, state S5-6 is obtained by merging state 5 into state 6 in $G^{15}$, and state S7-8 is obtained by merging state 7 into state 8 in $G^{15}$. Note that the label (word) of each edge in H uniquely determines the terminal state of that edge; in fact, the last runlength in that word identifies that terminal state. Such graphs H are said to have memory 1.

The adjacency matrix of H is given by $A_H$ and is shown in FIG. 17 with an $(A_H, 2^8)$-approximate eigenvector $y=[1122221]^T$.

States with weight greater than 1 need to be split. When a state u is split, two or more descendent states are formed. The incoming edges to u are duplicated into each of the descendent states, whereas the outgoing edges from u are partitioned among the descendent states. In addition, the weight of u is shared among the descendent states so that, after the splitting, the following holds: The weights of the descendent states are positive integers that sum up to the weight of their parent state, and the weights of the terminal states of the edges outgoing from each descendent state v sum up to at least $2^8$ times the weight of v. An encoder is obtained after several rounds of splitting, when all weights become 1. In the graph H, there are four states that need to be split, namely, states S2, S3, S4, and S5-6. It can be verified that each of these states can be split into two states, resulting in descendent states each having at least $2^8$ outgoing edges. In fact, after splitting, most states will have more than $2^8$ outgoing edges, which will allow having alternate codewords and hence DC control. We point out that the encoder in the reference, "EFMPlus: The Coding Format of the Multimedia Compact Disc", Proc. 16th Symp. on Inform. Theory in the Benelux, Nieuwerkerk a/d Yssel, May 18–19, 1995, the (2,10)-RLL constraint can be obtained in a similar manner by one state splitting. On the other hand, we did not have to apply state splitting in order to obtain the previously described (2,10)-RLL encoder.

Straightforward splitting of the four states with weight 2 in H may result in 11 encoder states. To reduce the number of encoder states and to obtain a compact codeword table, we turn to the next design step of defining a certain order on the outgoing edges (or rather, their labels) from each state in H. The specific order we choose will allow for simple decoding rules.

To this end, we write down all words of length 15 that satisfy the (2,12)-RLL constraint, according to descending order of their first runlength. We omit words that end with a runlength of 9 or more, since the respective edges were deleted when H was formed. On the other hand, each word ending with a runlength of 2, 3, 4, 5 or 6 will be written twice, in two consecutive places. Indeed, those words correspond to edges that were duplicated due to the splitting of states S2, S3, S4, and S5-6. The resulting list consists of 551 words and will serve as the codeword table of the encoder.

If we count edges with their multiplicity according to the weight of their terminal state, we find that there are $\Sigma_v(A_H)$ $_{s0,\upsilon}x_\upsilon=2^8$ outgoing edges from state S0 in H, and their labels start with runlengths between 2 and 12. Those labels appear as the first $2^8$ codewords in the table. Similarly, the first runlength of the labels of the edges outgoing from state S1 ranges between 1 and 11. Those labels appear in the table at $\Sigma_\upsilon(A_H)_{S1,\upsilon}x_\upsilon=374$ consecutive entries, starting at address 002 (the third entry).

Figures 18, 20:
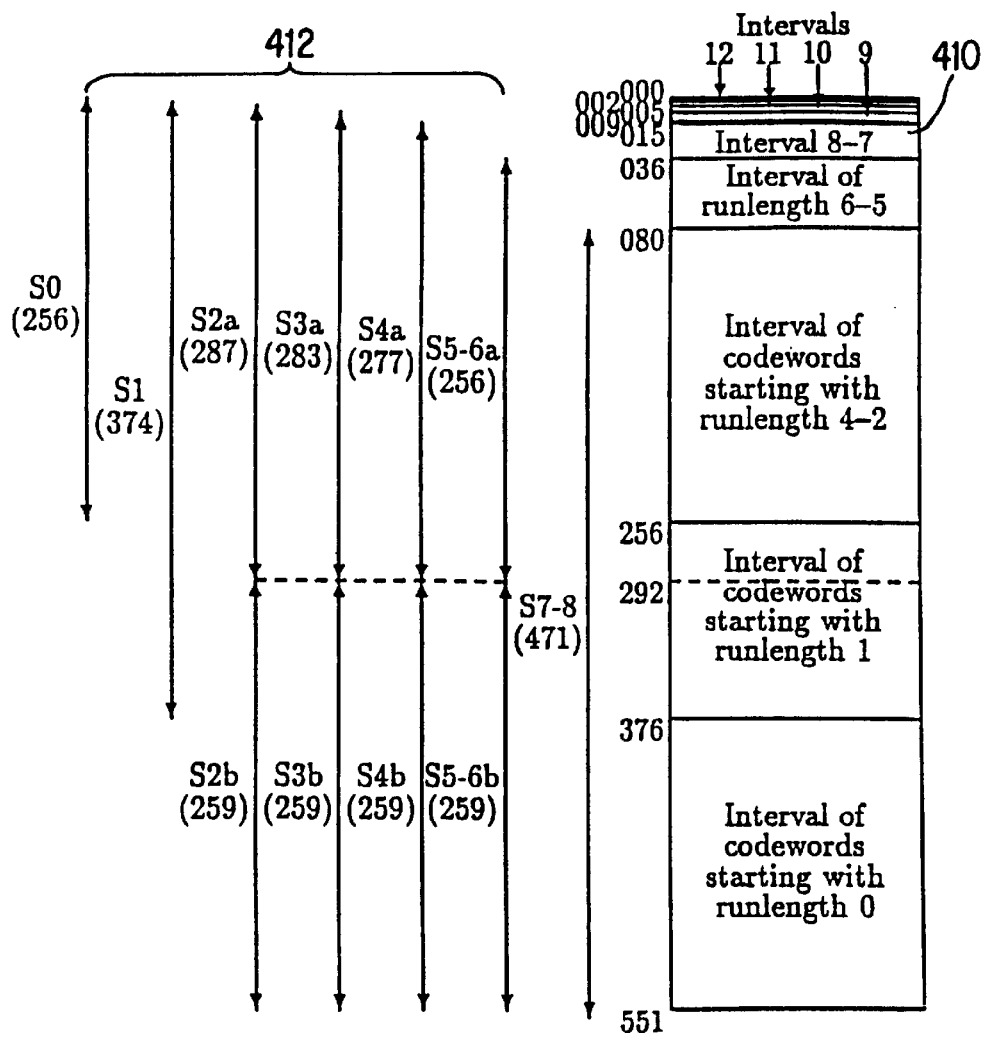
FIG. 18 is a schematic diagram showing the location of codewords in the table that can be generated from each state in H.
FIG. 20 shows the stationary probability of encoder states.

FIG. 18 is a schematic diagram showing the location of codewords in the table that can be generated from each state in H. The encoder table 410 is a table of 551 codewords, divided into runlength intervals according to their first runlength. Some runlengths have been combined in the figure; e.g., all codewords that start with a runlength between 2 and 4 are marked as one runlength interval.

The two-sided vertical arrows 412 mark the locations of codewords that can be generated from each state in H. The number of codewords (counting multiplicity) that correspond to each state are written in parentheses under the state name. For every state u, this number is equal to $\Sigma_\upsilon(A_H)_{u,\upsilon}x_\upsilon$. Note that the runlengths were clustered into runlength intervals in the table in such a way that the interval boundaries separate between segments of the table that correspond to different states in H.

FIG. 18 also shows a splitting of states S2, S3, S4, and S5-6 which is marked by the dashed line. In each one of those states, the outgoing edges are partitioned so that edges labeled by codewords that are located at addresses <292 belong to a descendent state that inherits the name of the parent state with a suffix "a". The rest of the edges belong to the other descendent state that inherits the name of the parent state with the suffix "b". The number 292 was chosen so that state S5-6a will have at least $2^8$ outgoing edges. In order to have a valid splitting, we make sure that the entries at addresses 291 and 292 do not contain two copies of the same codeword. Each incoming edge to a state that was split is duplicated to enter both descendents of that state, and both new edges inherit the same label of the parent edge. A duplicated codeword in the table corresponds to such a duplicated edge. We will follow a convention whereby the first copy in the table of such a codeword corresponds to an edge entering state "a", whereas the second copy enters state "b".

The following observations can be made:

All codewords that can be generated from a given state form a contiguous segment of the table. Using an observation made in the reference "Sequence-state methods for run-length-limited coding," Franaszek et al., IBM J. Res. Develop., 14 (1970), 376–383, a contiguous segment can be generated for any (d, k)-RLL constraint. Segments of the table that correspond to different states can overlap, thus resulting in a compact table that serves all states.

States S2b, S3b, S4b, and S5-6b are equivalent in the sense that the sets of codeword sequences that can be generated from each one of those states are the same. Therefore, we can combine those states into one state which we call S2-6b.

All states, with the exception of S0 and S5-6a, have more than $2^8$ outgoing edges. States S1 and S7-8 have significantly more edges.

The current table already allows for a coding scheme as follows: Encoding is carried out by adding a two-bit prefix to the input byte as shown in FIG. 5. The two-bit prefix is chosen so that the resulting address falls within the address range of the (contiguous) segment of the table that corresponds to the current state, as determined by FIG. 18. Since the table segment of each state consists of at least $2^8$ codewords, such a prefix can always be found. In fact, in many cases more than one prefix is possible. Finding the right prefix can be translated into threshold comparison.

We demonstrate this on state S2a. The table segment that corresponds to this state occupies addresses a in the range 005<a<292. If the input byte is a number b in the range 005<b<256, then b can serve as the address to the table from which the codeword is to be taken. Otherwise, if b<005, then we obtain the address by adding $2^8$ (or prefixing '01') to b. Notice that prefixing '01' yields a valid address also when b <036. Therefore, we set the thresholds T1 and T2 to 005 and 036, respectively, and encoding will proceed as follows:

if b<T1, then the prefix is '01'; otherwise,
if b<T2, then the prefix can be either '01' or '00';otherwise, the prefix is '00'. These thresholds and prefixes coincide with those in FIG. 12.

Decoding is carried out as follows: If the received codeword appears once in the table, then the input byte is uniquely determined by the address of that codeword. Note that this holds regardless of the state from which this codeword was generated during encoding. If the codeword appears twice, then we need to verify whether the next encoder state was an "a" descendent of a state or rather state S2-6b. Codewords that can be generated from "a" states appear in the table at addresses smaller than 292, whereas codewords that can be generated from state S2-6b appear at addresses >292. Therefore, by determining which section of the table the next codeword is located in the decoder can fully recover the input byte.

Recall that codewords that appear twice in the table occupy consecutive addresses. If, in addition, we manage to put the first codeword in each such pair at an even address, then the most significant seven bits of the current input byte will be determined by the current received codeword. Such an assignment of addresses can be easily obtained in our case.

B. DC Control

So far, we have shown how a table can be constructed so that encoding and decoding are efficient and error propagation is limited. We will now reorder the codewords in our table so that the structure of FIG. 18 is maintained, while satisfying additional conditions to allow for DC control.

More specifically, let a and a $+2^8$ be two addresses in the table, both belonging to the same table segment corresponding to some state in H. Then, we require that, to the largest extent possible, the following two conditions will hold for every such pair of addresses:

(C1) The terminal states of the codewords at addresses a and a $+2^8$ should be the same. If this condition is satisfied, then we can interchangeably encode any one of those two codewords, without affecting subsequent encoded codewords.

(C2) The codewords at addresses a and a $+2^8$ should have different parities (of number of 1's). The option to choose between these two codewords during encoding will yield the desired effect of DC control.

In our case, for all $002<a<551-2^8=295$, there is a state in H such that both a and a $+2^8$ belong to the segment corresponding to that state in the table. For the sake of simplicity, we will apply conditions (C1) and (C2) also to the remaining addresses 000 and 001. This way, we obtain a "semi-periodic" table where the codewords at every pair of addresses at distance $2^8$ apart have the same terminal state and different parities (to the largest extent possible).

We reorder the table using the following procedure.

```
n = 2^8; M = 551;

s ← 0;

while (s + n < M){ l ← min(t | > s and t − ni is a runlength interval boundary for some i = 0, 1, ... , ⌊s/n⌋);

h ← min(t | > s and t + n is a runlength interval boundary);

if(l ≤ h){

Reorder [sn, hn) so that [s + n, l + n) matches [s, l);

s ← l;} else {

Reorder [s − ni, l − ni) simultaneously for i = 0, 1, ... , ⌊s/n⌋ so that (s − ni, h − ni) match [s + n, h + m);

s ← h;}}
```

Table portions that start at address x and end at address y−1 (inclusive) are denoted in the procedure by [x,y). The basic idea of the procedure is scanning the table, starting at address 000, and identifying table portions (s, l) such that for every i=0,1, ... ⌊s/$2^8$⌋, each of the portions [s−$2^8$i, l−$2^8$i) is entirely contained in some runlength interval in the table. We then look at a new portion [s+$2^8$, h+$2^8$), which is also entirely contained in some runlength interval. If 1≦h, then we reorder the portion [s+$2^8$, h+$2^8$) so that its (l−s)-prefix matches the portion (s, l), codeword by codeword, in terms of conditions (C1) and (C2). This might not always be possible, but in many cases it is, partly because in many cases h is significantly larger than 1. If l>h, then we reorder the portions [s−$2^8$i, t−$2^8$i) simultaneously for i=0,1, ... , ⌊s/$2^8$⌋, to match [s+$2^8$, h+$2^8$).

Applying this procedure to our table, we obtain a reordering of the table where condition (C1) is fully met, whereas condition (C2) is satisfied for all but 16 pairs of addresses.

The procedure would have found a full matching had there existed one.

This procedure can be generalized to obtain a semi-periodic table for any table-based rate p:q encoder for a (d, k)-RLL constraint with q>k that has been constructed along the lines of Sections III (namely, the encoder is obtained by state splitting of a graph presentation H of a subset of the (d, k)-RLL constraint, and then constructing an encoder table in which codewords are ordered according to their first runlength and duplicated according to the weights of their terminal states in H). The procedure will find a full matching if there exists one whenever address $2^p$ in the table is an interval boundary of one of the runlength ranges. The procedure can be easily adapted to handle also the case where there are two interval boundaries in the table at a distance which is close to $2^p$.

The state diagram of the resulting encoder is a graph $\epsilon$ with eight states, and the adjacency matrix of $\epsilon$ is an 8×8 matrix $A_\epsilon$ where all the rows are equal to [59 40 28 19 13 15 75 7].

Rows and columns are indexed by the encoder states, according to the following order: S0,S1, S2a, S3a, S4a, S5-6a, S2-6b, and S7-8. The entries in $A_\epsilon$ do not take into account alternate codewords that are used for DC control. These, in turn, are counted separately in the following matrix $D_\epsilon$ which is shown in FIG. 19. Referring to the matrix $D_\epsilon$, 16 additional codewords that could have been generated from state S7-8 have been omitted since they do not satisfy condition (C2).

The peculiarity of having equal rows in $A_\epsilon$ for all encoder states is a consequence of the fact that the terminal states are the same for codewords that are located in the table at addresses which are at distance $2^8$ apart. Therefore, the distribution of the terminal states of the first $2^8$ outgoing edges from a given encoder state is the same for all encoder states.

FIG. 20 shows the stationary probabilities of the encoder states. The stationary probability of being at a given encoder state u is obtained by dividing $(A_\epsilon)_{v,u}$ (for an arbitrary v) by $2^8$. These probabilities are summarized in the second column of the table shown in FIG. 20. The entries in the third column of the table shown in FIG. 20 are obtained by dividing each row-sum in $D_\epsilon$ by $2^8$. These numbers measure for each encoder state the fraction of input bytes that allow for DC control from that state. The expectation of those numbers, with respect to the stationary probabilities, yields the average fraction of input bytes in a random sequence that allow for DC control. This average is equal to 0.1219.

It is worthwhile pointing out that the Shannon capacity of the (2,12)-RLL constraint is 0.547 and, therefore, the encoder operates at a rate, 8:15, which is just 2.5% below capacity. Furthermore, the effective Shannon capacity of a (2,12)-RLL constraint having a DC control in 12.19% of the input bytes is 0.536, which means that the Level-8 encoder operates at a rate which is only 0.5% below the effective capacity.

The discussion in this section has concentrated on the design of the Level-8 encoder. Reduction in the number of states (at the expense of a more limited DC control) can be obtained by merging and deleting states according to the table shown in FIG. 13. The incoming edges to a deleted state u are redirected to one of the states v with the property that every codeword sequence that can be generated from v can also be generated from u (and, in fact, it can be generated from u for the same sequence of input bytes). Similar design tools can be applied to obtain the previously described (2,10)-RLL encoder of Section 2, as well as encoders for other certain (d,k)-RLL constraints.

It is understood that the above description is intended to be illustrative and not restrictive. For example, the coding system may be based on other constraints than the (d,k)-RLL constraint. Further, the arrangement of codewords or table size may vary. For example, the table size may vary dependent on the number of states split, merged, and deleted. Further, depending on the design, there may be more than one alternative codeword candidate. The scope of the invention should therefore not be determined with reference to the above description, but instead should be determined with reference to the appended claims, along with the full scope of equivalents to which such claims are entitled.

What is claimed is:

1. A method of encoding a sequence of input blocks each block comprised of p bits, into a sequence of codewords each codeword comprised of q bits, the sequence of codewords satisfying a d-constraint such that consecutive bits of one type characterized by a transition are separated by at least d bits of another type characterized by an absence of a transition, and satisfying a k-constraint such that no more than a maximum of k bits of the other type occur between successive bits of the one type, comprising the steps of:

receiving said sequence of block p bit input blocks; and converting each of the p bit input blocks into a corresponding codeword of q serial bits using an encoder, the encoder including an encoding table, the encoding table being representative of a number of states $x_1, x_2, \ldots, x_n$, wherein at least a subset of the codewords in a first state are identical to a subset of codewords in a second state, and further wherein the addresses for the subset of codewords in the first state are identical to the addresses for the subset of codewords in the second state.

2. The method recited in claim 1 wherein the address of the codeword in the encoding table corresponding to the input block is determined by appending a prefix having a fixed number of bits to the input block.

3. The method recited in claim 2 wherein the prefix may have more than one possible value resulting in more than one possible codeword value.

4. The method recited in claim 3 wherein the value of the prefix appended to the input block is determined based on a comparison of the value of the input block to a first threshold value and to a second threshold value.

5. The method recited in claim 4 wherein the value of the first threshold value and the value of the second threshold value depend on the current state of the encoder.

6. The method recited in claim 1 wherein the final runlength of the codeword determines the next state of the encoder.

7. The method recited in claim 3 wherein the more than one possible codeword values end in a final run that leads to the same state.

8. The method recited in claim 3 wherein the more than one possible codeword values have different parities.

9. The method recited in claim 3 wherein the more than one possible codeword values have different values of the DC component.

10. The method recited in claim 1 wherein each of the codewords in the coding table has a unique value.

11. The method recited in claim 1 further including the step of defining the codewords of the encoding table, wherein the codewords are defined prior to the step of converting each input block into a corresponding codeword.

12. The method recited in claim 11 wherein defining the codewords of the encoding table includes the steps of:

determining the adjacency matrix $A_G$;

computing an approximate eigenvector of the adjacency matrix $A_G$;

deleting states with zero weight;

merging at least a subset of the states having the same weight;

responsive to the deleted states and merged states, determining a new adjacency matrix $A_H$; and reducing the number of encoder states.

13. The method recited in claim 12, further including the step of reordering the codewords to satisfy DC control conditions.

14. The method recited in claim 13 wherein the step of reordering the codewords to satisfy the DC control conditions further includes the steps of:

maximizing the number of addresses a and a $+2^P$ containing codewords that lead to the same next state; and maximizing the number of addresses a and a $+2^P$ where the codewords have different parities.

15. The method recited in claim 12 wherein the step of reducing the number of encoder states includes the step of defining the order on the outgoing edges for each state in the adjacency matrix $A_H$.

16. The method recited in claim 15 further including the step of reducing the number of encoder states further includes the steps of:

establishing all the words that satisfy the (d,k) constraint;

deleting edges that were deleted during formation of graph H; and deleting words ending in runlength greater than the edges that were deleted during formation of the graph H.

17. The method recited in claim 13 wherein the step of reordering the codewords to satisfy the DC control conditions further includes the steps of:

maximizing the number of addresses a and a $+2^P$ containing codewords that lead to the same next state; and maximizing the number of addresses a and a $+2^P$ where the codewords have different values of the DC component.

18. A method of encoding and decoding a sequence of input blocks each block comprised of p bits, into a sequence of codewords each codeword comprised of q bits, the sequence of codewords satisfying a d-constraint such that consecutive bits of one type characterized by a transition are separated by at least d bits of another type characterized by an absence of a transition, and satisfying a k-constraint such that no more than a maximum of k bits of the other type occur between successive bits of the one type, comprising the steps of:

receiving said sequence of block p bit input blocks;

converting each of the p bit input blocks into a corresponding codeword of q serial bits using an encoder, the encoder including an encoding table, the encoding table being representative of a number of states $x_1, x_2, \ldots, x_n$, wherein at least a subset of the codewords in a first state are identical to a subset of codewords in a second state, and further wherein the addresses for the subset of codewords in the first state are identical to the addresses for the subset of codewords in the second state; and decoding each codeword.

19. A coding system for encoding and decoding a sequence of input blocks each block comprised of p bits, into a sequence of codewords each codeword comprised of q bits, the sequence of codewords satisfying a d-constraint such that consecutive bits of one type characterized by a transition are separated by at least d bits of another type characterized by an absence of a transition, and satisfying a k-constraint such that no more than a maximum of k bits of the other type occur between successive bits of the one type, the system comprised of:

a converting means for converting each input block into a corresponding codeword of q serial bits using an encoder, the encoder including an encoding table, the encoding table being representative of a number of states $x_1, x_2, \ldots, x_n$, wherein at least a subset of the codewords in a first state are identical to a subset of codewords in a second state, and further wherein the addresses for the subset of codewords in the first state are identical to the addresses for the subset of codewords in the second state; and a decoding means for decoding each codeword.

20. A method of encoding a sequence of input blocks each block comprised of p bits, into a sequence of codewords each codeword comprised of q bits, the sequence of codewords satisfying a d-constraint such that consecutive bits of one type characterized by a transition are separated by at least d bits of another type characterized by an absence of a transition, and satisfying a k-constraint such that no more than a maximum of k bits of the other type occur between successive bits of the one type, comprising the steps of:

receiving said sequence of p bit input blocks; and converting each of the p input blocks into a corresponding codeword of q serial bits using an encoder, wherein the corresponding codeword is unique for each p input block such that the same codeword is not generated for two different p input blocks, the encoder including an encoding table, the encoding table being representative of a number of states $x_1, x_2, \ldots, x_n$, wherein at least a subset of the codewords in a first state are identical to a subset of codewords in a second state, and further wherein the addresses for the subset of codewords in the first state are identical to the addresses for the subset of codewords in the second state.

21. The method recited in claim 20 wherein the address of the codeword in the encoding table corresponding to the input block is determined by appending a prefix having a fixed number of bits to the input block.

22. The method recited in claim 21 wherein the prefix may have more than one possible value resulting in more than one possible codeword value.

23. The method recited in claim 22 wherein the value of the prefix appended to the input block is determined based on a comparison of the value of the input block to a first threshold value and to a second threshold value.

24. The method recited in claim 23 wherein the value of the first threshold value and the value of the second threshold value depend on the current state of the encoder.

25. The method recited in claim 20 wherein the final runlength of the codeword determines the next state of the encoder.

26. The method recited in claim 22 wherein the more than one possible codeword values end in a final run that leads to the same state.

27. The method recited in claim 22 wherein the more than one possible codeword values have different parities.

28. The method recited in claim 22 wherein the more than one possible codeword values have different values of the DC component.

29. A method of encoding a sequence of input blocks each block comprised of p bits, into a sequence of codewords each codeword comprised of q bits, the sequence of codewords satisfying a d-constraint such that consecutive bits of one type characterized by a transition satisfying a k-constraint such that no more than a maximum of k bits of the other type occur between successive bits of the one type, comprising the steps of:

receiving said sequence of p bit input blocks; and converting each of the p input blocks into a corresponding codeword of q serial bits using an encoder, the encoder including an encoding table, the encoding table being representative of a number of states $x_1, x_2, \ldots, x_n$, wherein at least a subset of the codewords in a first state are identical to a subset of codewords in a second state, and further wherein the addresses for the subset of codewords in the first state are identical to the addresses for the subset of codewords in the second state, wherein each segment of the encoding table that corresponds to a given state is located in the encoding table as consecutive codewords.

30. The method recited in claim 29 wherein the address of the codeword in the encoding table corresponding to the input block is determined by appending a prefix having a fixed number of bits to the input block.

31. The method recited in claim 30 wherein the prefix may have more than one possible value resulting in more than one possible codeword value.

32. The method recited in claim 31 wherein the value of the prefix appended to the input block is determined based on a comparison of the value of the input block to a first threshold value and to a second threshold value.

33. The method recited in claim 32 wherein the value of the first threshold value and the value of the second threshold value depend on the current state of the encoder.

34. The method recited in claim 29 wherein the final runlength of the codeword determines the next state of the encoder.

35. The method recited in claim 31 wherein the more than one possible codeword values end in a final run that leads to the same state.

36. The method recited in claim 31 wherein the more than one possible codeword values have different values of the DC component.

37. The method recited in claim 31 wherein the more than one possible codeword values have different parities.

38. The method recited in claim 29 wherein each of the codewords in the coding table has a unique value.

* * * * *

UNITED STATES PATENT AND TRADEMARK OFFICE
CERTIFICATE OF CORRECTION

PATENT NO.    : 6,002,718
DATED         : December 14, 1999
INVENTOR(S)   : Roth It is certified that error appears in the above-identified patent and that said Letters Patent is hereby corrected as shown below:

Column 1,
Line 28, after "5." do not begin a new paragraph

Column 13,
Line 41, after "addresses." do not begin a new paragraph

Column 15,
Line 19, after "sequence of" delete "block"

Column 16,
Line 48, after "sequence of" delete "block"

Signed and Sealed this

Sixth Day of May, 2003

JAMES E. ROGAN
*Director of the United States Patent and Trademark Office*